United States Patent
Choa-Eoan et al.

(10) Patent No.: US 7,902,654 B2
(45) Date of Patent: Mar. 8, 2011

(54) SYSTEM AND METHOD OF SILICON SWITCHED POWER DELIVERY USING A PACKAGE

(75) Inventors: Lew G. Choa-Eoan, Carlsbad, CA (US); Thomas R. Toms, Dripping Springs, TX (US); Boris Dimitrov Andreev, San Diego, CA (US); Justin Joseph Rosen Gagne, San Diego, CA (US); Chunlei Shi, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 800 days.

(21) Appl. No.: 11/431,790

(22) Filed: May 10, 2006

(65) Prior Publication Data

US 2007/0262438 A1 Nov. 15, 2007

(51) Int. Cl.
*H01L 23/52* (2006.01)
(52) U.S. Cl. ... 257/691; 257/693; 257/724; 257/E23.079
(58) Field of Classification Search ................. 257/691, 257/693, 724, E23.079
See application file for complete search history.

(56) References Cited

U.S. PATENT DOCUMENTS

| | | | |
|---|---|---|---|
| 6,118,328 A | 9/2000 | Morikawa |
| 6,242,896 B1 | 6/2001 | Nieberger |
| 6,337,580 B2 | 1/2002 | Muramatsu |
| 6,404,172 B1 | 6/2002 | May |
| 6,499,658 B2 | 12/2002 | Goetz et al. |
| 6,864,708 B2 | 3/2005 | Takahashi et al. |
| 6,879,142 B2 | 4/2005 | Chen |
| 6,979,982 B2 | 12/2005 | Herbert |
| 7,057,446 B2 | 6/2006 | Choi et al. |
| 7,075,280 B2 | 7/2006 | May |

(Continued)

FOREIGN PATENT DOCUMENTS

WO 2005038920 4/2005

(Continued)

OTHER PUBLICATIONS

Mutoh S et al: "A 1 V Milti-Threshold Voltage CMOS DSP With an Efficient Power Management Technoque for Mobile Phone Application" Solid-State Circuits Conference, 1996. Digest FO Technical Papers. 42nd ISSCCL, 1996 IEEE International San Francisco, CA, US Feb. 8-10, 1996, New York, NY, USA, IEEE, US, (Feb. 8, 1996), pp. 168-169, 438, XP01056440.

(Continued)

*Primary Examiner* — Tu-Tu V Ho
(74) *Attorney, Agent, or Firm* — Peter M. Kamarchik; Michelle Gallardo; Jonathan T. Velasco

(57) ABSTRACT

In one particular embodiment, an integrated circuit includes a package and a substrate electrically and physically coupled to the package. The package includes a first pin, a second pin, and metallization coupling the first pin to the second pin. The substrate is coupled to the package via the first pin and the second pin. The substrate includes a plurality of power domains and a power control unit. The second pin of the package is coupled to a particular power domain of the plurality of power domains. The power control unit includes logic and a switch, where the switch includes a first terminal coupled to a voltage supply terminal, a control terminal coupled to the logic, and a second terminal coupled to the first pin of the package. The logic selectively activates the switch to distribute power to the particular power domain via the metallization of the package.

36 Claims, 10 Drawing Sheets

U.S. PATENT DOCUMENTS

| | | | |
|---|---|---|---|
| 7,088,002 B2 | 8/2006 | Jensen | |
| 7,098,632 B2 | 8/2006 | Chen et al. | |
| 7,187,527 B2* | 3/2007 | Su et al. | |
| 7,372,161 B2 | 5/2008 | Lin et al. | |
| 7,393,604 B2 | 7/2008 | Rocke et al. | |
| 7,405,497 B2 | 7/2008 | Jacobs et al. | |
| 7,508,686 B2 | 3/2009 | May | |
| 2002/0011518 A1* | 1/2002 | Goetz et al. | 235/385 |
| 2002/0074161 A1* | 6/2002 | Jensen | 174/262 |
| 2003/0025130 A1 | 2/2003 | Takahashi et al. | |
| 2004/0108890 A1* | 6/2004 | Choi et al. | 327/541 |
| 2004/0232899 A1* | 11/2004 | Herbert | 323/282 |
| 2005/0058857 A1* | 3/2005 | Rocke et al. | 429/9 |
| 2005/0104177 A1* | 5/2005 | Lin et al. | 257/678 |
| 2005/0225177 A1* | 10/2005 | Jacobs et al. | 307/82 |
| 2006/0044718 A1* | 3/2006 | Su et al. | 361/56 |
| 2006/0061383 A1 | 3/2006 | Huang et al. | |
| 2007/0002600 A1 | 1/2007 | May | |
| 2007/0008011 A1 | 1/2007 | Thurston | |

FOREIGN PATENT DOCUMENTS

| | | |
|---|---|---|
| WO | 2006026627 | 3/2006 |

OTHER PUBLICATIONS

International Search Report-PCT/US07/067227, International Search Authority-Eurpean Patent Office-Oct. 1, 2007.
Written Opinion-PCT/US07/067227, International Search Authority-European Patent Office-Oct. 1, 2007.

* cited by examiner

SYSTEM AND METHOD OF SILICON SWITCHED POWER DELIVERY USING A PACKAGE

BACKGROUND

I. Field

The present disclosure generally relates to systems and methods of power distribution in a circuit, and more particularly to systems and methods using low-resistance package metals to distribute switched power or signals to designated areas of a silicon substrate.

II. Description of Related Art

Advances in technology have resulted in smaller and more powerful personal computing devices. For example, a variety of portable personal computing devices, including wireless computing devices, such as portable wireless telephones, personal digital assistants (PDAs), and paging devices are small, lightweight, and easily carried by users. More specifically, portable wireless telephones, such as cellular (analog and digital) telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can include a web interface that can be used to access the Internet. As such, these wireless telephones include significant computing capabilities.

Within such devices, the circuitry is becoming smaller, and power consumption by the circuitry is becoming increasingly significant to performance. A typical integrated circuit includes a substrate, which may include a plurality of embedded circuit structures, as well as one or more integrated circuit devices that are electrically coupled to the substrate. A large number of such circuit devices are made using designs in which the input/output (I/O) circuits can be placed in different locations and are not limited to the periphery of the chip. This type of device can be referred to as a flip chip. The flip chip technology allows an integrated circuit device or package to be physically and electrically coupled to a substrate by inverting and bonding the package face down to the substrate interconnection pattern, using raised metallic bonding bumps on each of the package mounting pads corresponding to the conductive pads or areas on the substrate. The bonding bumps or balls join the conductive pads of the package to the conductive areas on the substrate by using controlled reflow solder techniques or conductive epoxy techniques.

One aspect of the physical design of flip chips relative to input/output (I/O) circuits is the sizing and routing of the wiring that connects the I/O circuits to the appropriate on-chip power distribution networks. Power routing of flip chip circuits is the process of connecting the power service terminals of each I/O pin of the flip chip circuit to the power distribution network of the substrate to supply power to circuitry of the flip chip. In general, the power service terminals are coupled to the power distribution network by metal wires or traces, which may be referred to as power routes. By controlling the widths of the power routes, the effective resistance and the current densities of the power routes can be controlled to satisfy the electrical requirements of a design.

As chips have become smaller, the resistance of metal layers within a silicon substrate has increased while the power densities have also increased. To address the increased power densities, additional thick metal layers may be added for power redistribution to lower the resistive losses in the distribution network. However, such designs increase routing complexity and decrease available area for component layout on the substrate.

Accordingly, it would be advantageous to provide an improved power distribution system and method that reduces power loss and thermal loads and that allows for continued process scaling.

SUMMARY

In one particular embodiment, an integrated circuit includes a package and a substrate that is electrically and physically coupled to the package. The package includes a first pin, a second pin, and metallization coupling the first pin to the second pin. The substrate is coupled to the package via the first pin and the second pin. The substrate includes a plurality of power domains and a power control unit. The second pin of the package is coupled to a particular power domain of the plurality of power domains. The power control unit includes logic and a switch, where the switch includes a first terminal coupled to a voltage supply terminal, a control terminal coupled to the logic, and a second terminal coupled to the first pin of the package. The logic selectively activates the switch to distribute power to the particular power domain via the metallization of the package.

In one embodiment, the particular power domain includes a processing unit embedded in the substrate. In another embodiment, the switch is sized to meet a peak demand of the processing unit. In yet another embodiment, the peak demand of the processing unit is less than a peak power density multiplied by the area of the processing unit.

In still another embodiment, the switch includes a plurality of independent transistors, the logic activates the plurality of independent transistors in stages, and each of the stages includes at least one of the plurality of independent transistors. In yet another embodiment, the power control unit is adapted to generate a current ramp to charge a capacitance associated with the particular power domain. In still another embodiment, the logic is adapted to generate a power on reset signal to reset the particular power domain. In another particular embodiment, the particular power domain further includes a clamp circuit to clamp outputs from the particular power domain to a known logic state, wherein the logic generates an output clamp signal to activate the clamp circuit.

In another embodiment, the power supply voltage terminal includes an output terminal of a second package. In yet another embodiment, the substrate further includes an electrical trace that is coupled to the second terminal and to an electrical component of the particular power domain to distribute power to the electrical component via the electrical trace in parallel with the metallization of the package. In another particular embodiment, the switch is configured to supply a maximum unit load that is less than a sum of maximum loads of each of the loads of the plurality of particular power domains.

In another embodiment, a method includes receiving a switch activation signal at a control terminal of a switch that is embedded in a substrate. The substrate includes a plurality of domains, and the switch is located in a first domain of the plurality of domains. The method also includes switching a signal to a first pin of a package coupled to the substrate via the switch in response to receiving the switch activation signal. The method also includes receiving the signal at a second domain of the plurality of domains from a second pin of the package.

In another embodiment, receiving a switch activation signal includes receiving a control signal from power control logic at the control terminal of the switch. In still another embodiment, the first pin and the second pin include bumps, and the package includes a flip-chip package physically and electrically coupled to the substrate by the bumps. In still another embodiment, switching the signal includes selectively coupling a terminal of the switch to the first pin of the package to route the signal via metallization of the package. In another embodiment, the signal is a power supply voltage. In still another embodiment, the second domain includes a processor. In yet another embodiment, the switch includes a plurality of transistors, and switching the signal includes activating the plurality of transistors in stages over a number of clock cycles to produce a ramp supply voltage applied to the first pin of the package, where each stage includes at least one transistor of the plurality of transistors.

In another embodiment, a silicon switched power delivery system includes means for receiving a power supply from a voltage supply terminal at a power control unit of a substrate, means for receiving a control signal, and means for switching the power supply from the voltage supply terminal to a first power pin of a flip-chip package to distribute power from the voltage supply terminal to a localized power domain of the substrate. The flip-chip package includes the first power pin and a second power pin coupled to the localized power domain.

In one particular embodiment, the voltage supply terminal is a third pin coupled to a first metallization within the package, where the first metallization is coupled to a power manager integrated circuit. In yet another embodiment, the means for receiving a control signal includes a control terminal of a transistor device. In another embodiment, the switched power delivery system further includes means for controlling a clock signal to activate the switch over a number of cycles of the clock to provide a ramped power supply.

In another particular embodiment, a portable device includes an integrated circuit package. The integrated circuit package includes a first power input coupled to a power supply voltage terminal, a first power output, a first metallization to electrically couple the first power input and the first power output, a second power input, a second power output, and a second metallization to electrically couple the second power input and the second power output. The portable device also includes a substrate that is electrically and physically coupled to the integrated circuit package. The substrate includes a plurality of electrically isolated power domains, power control logic, a power supply input and a switch. The power supply input is coupled to the second power output and to a particular power domain of the plurality of electrically isolated power domains. The switch includes a first terminal coupled to the first power output of the integrated circuit, a control terminal and a second terminal coupled to the second power input of the integrated circuit package. The switch is responsive to the power control logic to selectively switch power to the particular power domain via the second metallization of the integrated circuit package.

In a particular embodiment, the portable device also includes a power module integrated circuit coupled to the power supply voltage terminal to provide a power supply voltage. A battery may provide the power supply voltage. In another particular embodiment, the power supply voltage terminal comprises an output pin of a second integrated circuit package. In still another particular embodiment, the switch includes a plurality of transistors in parallel, wherein the plurality of transistors are activated in stages to provide a ramped supply voltage to the second terminal. In still another particular embodiment, the portable device includes a radio frequency transceiver to send and receive radio frequency signals.

In another particular embodiment, an integrated circuit device has a controller and an electrical component. The controller includes a first input terminal and an external terminal output to communicate over a metallization portion of an off-substrate package. The electrical component is within a subdomain that is isolated from the controller with respect to a common substrate. The electrical component is responsive to the external terminal output via the metallization portion of the off-substrate package.

In one particular embodiment, the controller includes a switch coupled to the first input terminal and the external terminal output to selectively connect the first input terminal to the external terminal output. In another embodiment, the controller further includes logic to selectively activate the switch. In another embodiment, the controller is adapted to communicate a signal over the metallization portion of the off-substrate package to the electrical component. In yet another embodiment, the controller is adapted to communicate a power supply voltage over the metallization portion of the off-substrate package to activate the electrical component. In still another embodiment, the off-substrate package includes an integrated circuit that is physically and electrically coupled to the common substrate via bumps.

One particular advantage provided by embodiments of the power switching delivery systems and methods is the load circuit may utilize a global silicon power distribution network without the need to generate the switched supply in the same substrate area. This provides an advantage in that approximately 3% to 8% of the silicon overhead is removed from the load circuit, reducing the total power demand of the load circuit. Moreover, it is not necessary to dedicate metal resources of the substrate within the design of the load circuit to the generation of the switched supply.

Another advantage is provided in that, by centralizing the power control and by removing the switches from the load circuit, component placement on the substrate is simplified, since it is no longer necessary to route input power to the component and it is no longer necessary to route multiple power grids over and around the distributed switch circuit.

Still another particular advantage is that the switch may be sized to meet a peak demand of the processing unit, where the peak demand of the processing unit is less than a peak power density multiplied by the substrate area of the processing unit.

An additional advantage includes decoupling of the load circuit designs from power switching, which allows the switch to be constructed of thicker oxide devices that have lower current leakage and that operate at higher voltage levels.

Another particular advantage is that the load circuit can be designed for performance without having to engineer a power switch into the design to reduce standby power.

Yet another advantage is that the peak demand of the total load circuit is lower than the peak power density multiplied by the area of the load circuit. Accordingly, while a distributed switch may be designed to meet the peak power density, the concentrated supply switch can meet the peak demand of the entire load circuit. The peak demand of the entire load circuit may be on an order of ½ to ⅓rd of the peak power density multiplied by the area of the load circuit. Therefore, the size of the switch can be reduced by the same order of magnitude, while maintaining the voltage loss of the distributed switches.

Still another advantage is that the current utilized to cycle the power switch can be reduced and better managed, since the physical size of the switch can be reduced to a fraction of the size of the distributed switch. Moreover, the switch may be activated in stages, making it easier to control the current level and to achieve a desired fraction of the output supply current at an output of the switch.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following detailed description when taken in conjunction with the accompanying drawings wherein.

DETAILED DESCRIPTION

In a particular embodiment, a control unit within first domain of a substrate may utilize a metallization portion of an off-substrate package to selectively route power, signals, or a combination thereof to a second domain of the substrate that is electrically isolated from the first domain. The second domain may include, for example, an electrical component such as a processor, a memory, other integrated circuit resources, and the like. In integrated circuitry, the voltage efficiencies often have a significant impact overall performance. By routing power and signals through the off-substrate package, the control unit may reduce voltage loss by taking advantage of the metallization of the package, which typically has a lower electrical resistance than metal traces within the substrate. The control unit may route power or shut off power to selected components to activate or deactivate components of the substrate. In some instances, the activation and deactivation of components may be used to conserve power during periods of inactivity.

Figure 1:
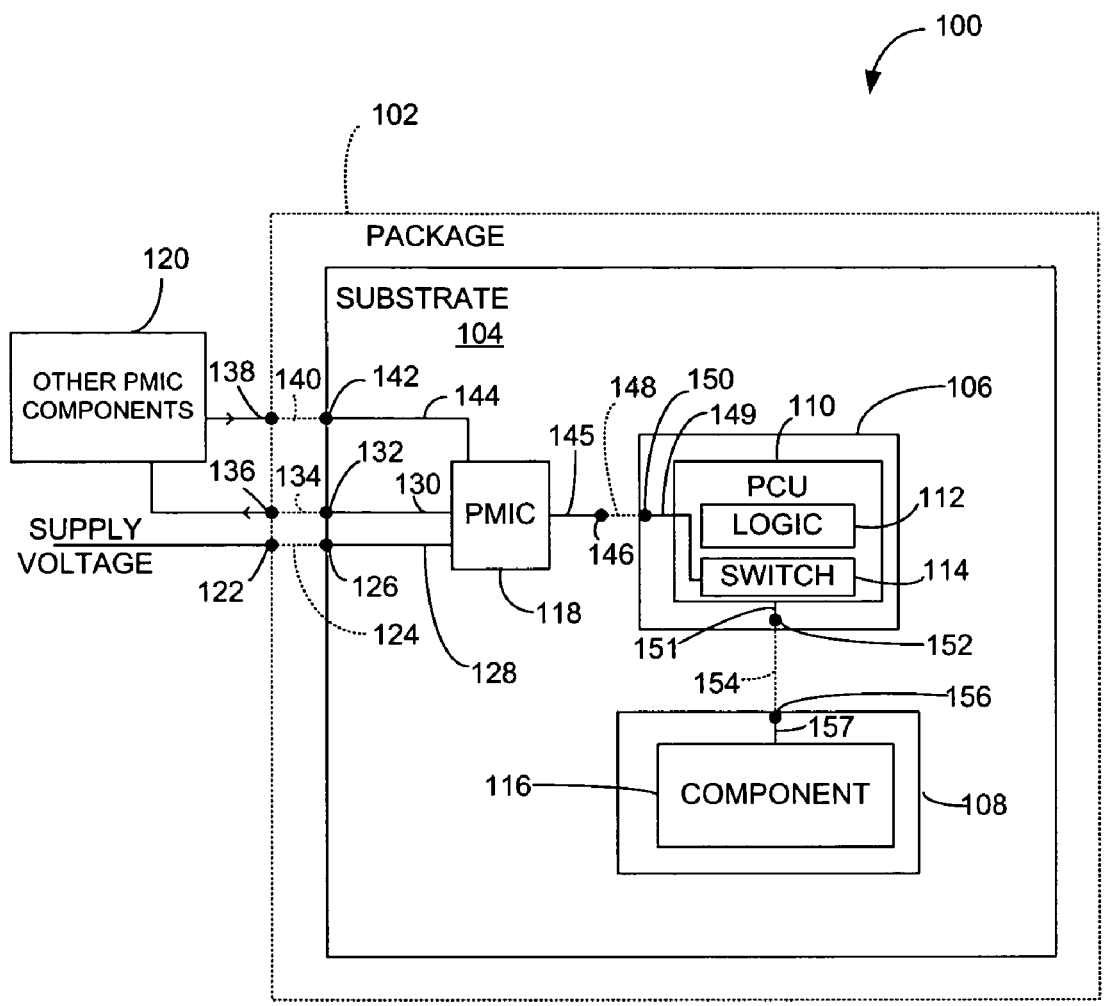
FIG. 1 is a block diagram illustrating a particular embodiment of an integrated circuit device including a package and a substrate with a switched power delivery system.

FIG. 1 is a block diagram illustrating a particular embodiment of an integrated circuit device 100 including a package 102 and a substrate 104 with a switched power delivery system. The circuit device 100 is shown from a top view where the package 102 is on top of the substrate 104, and devices and traces that are part of the package 102 are shown in phantom, while the devices and traces of the substrate 104 are indicated as solid lines.

The substrate 104 includes subdomains 106 and 108, which may be regions of the substrate 104 that are electrically isolated from one another. The subdomain 106 includes a power control unit (PCU) 110, which includes logic 112 and a switch 114. The subdomain 108 includes an electrical component 116, such as a processor, a memory, another circuit component, or any combination thereof. The substrate 104 also includes a power manager integrated circuit (PMIC) 118, which may be electrically coupled to other PMIC components 120, such as, for example, a capacitor, a resistor, an inductor, or any combination thereof In general, a package 102 may be connected to the substrate 104 via a flip chip technique. The pin 122 of the package 102 is coupled to a power supply voltage terminal to receive a power supply voltage. The package pin 122 is coupled to a bump 126 via a trace 124 on the package 102. The bump 126 is coupled to the PMIC 118 via a trace 128 on or within the substrate 104. The PMIC 118 may be adapted to make use of off-chip components, such as the other PMIC components 120, to provide a power supply voltage to the integrated circuit 100. In such an instance, the PMIC 118 includes an output trace 130 that connects to a bump 132. The bump 132 is connected to an output pin 136 of the package 102 via a package trace 134. The output pin 136 is coupled to the other PMIC components 120. An input pin 138 of the package is coupled to the other PMIC components 120 and is coupled to a bump 142 of the substrate 104 via a package trace 140. The bump 142 is connected to the PMIC 118 via a trace 144 on or within the substrate 104.

The PMIC 118 is connected to a bump 146 by a substrate trace 145. The bump 146 is connected to a bump 150 via a package trace 148. The PCU 110 is connected to the bump 150 via a substrate trace 149. The switch 114 is connected to a bump 152 by a substrate trace 151. The bump 152 is connected to a package trace 154, which is connected to a bump 156. The bump 156 is connected to the component 116 of the subdomain 108 via a substrate trace 157.

In operation, the PMIC 118 provides power to the power control unit (PCU) 110, which uses PCU logic 112 and the switch 114 to selectively provide power to the subdomain 108 that includes the component 116 via the substrate trace 151, the bump 152, the package trace 154, the bump 156 and the trace 157. The PCU 110 can be utilized to take advantage of much lower resistances of the package metals, such as trace 154 to redistribute a power supply voltage to other areas of the silicon substrate of the substrate 104. The PCU 110 may include multiple switches, such as the switch 114, each of which may be separately activated by the logic 112 to supply power to a particular subdomain of the substrate 104 via metallization traces within the package 102. In other words, instead of routing power through a global power grid of the substrate 104, power can be routed via the switch 114 through a metallization portion, such as a wire trace, of the package 102 to an electrically isolated subdomain of the substrate 104, such as the subdomain 108. It should also be appreciated that this technique may also be extended to signals, where signals can be routed via the much lower resistance metallization of the package 102, instead of through the higher resistance metal traces of the substrate 104.

Since the PCU 110 uses the low-resistance routing of the package 102 to distribute power to the floor plan of the substrate 104, a design of the PCU 110 is tightly coupled to both the package 102 and the substrate 104. In one embodiment, the PCU 110 connects to one or more flip chip bumps in a first power domain, such as the subdomain 106, and is coupled to one or more bumps of a second power domain, such as the subdomain 108. To keep power loss low, the PCU 110 may be placed near the second power domain.

Figure 2:
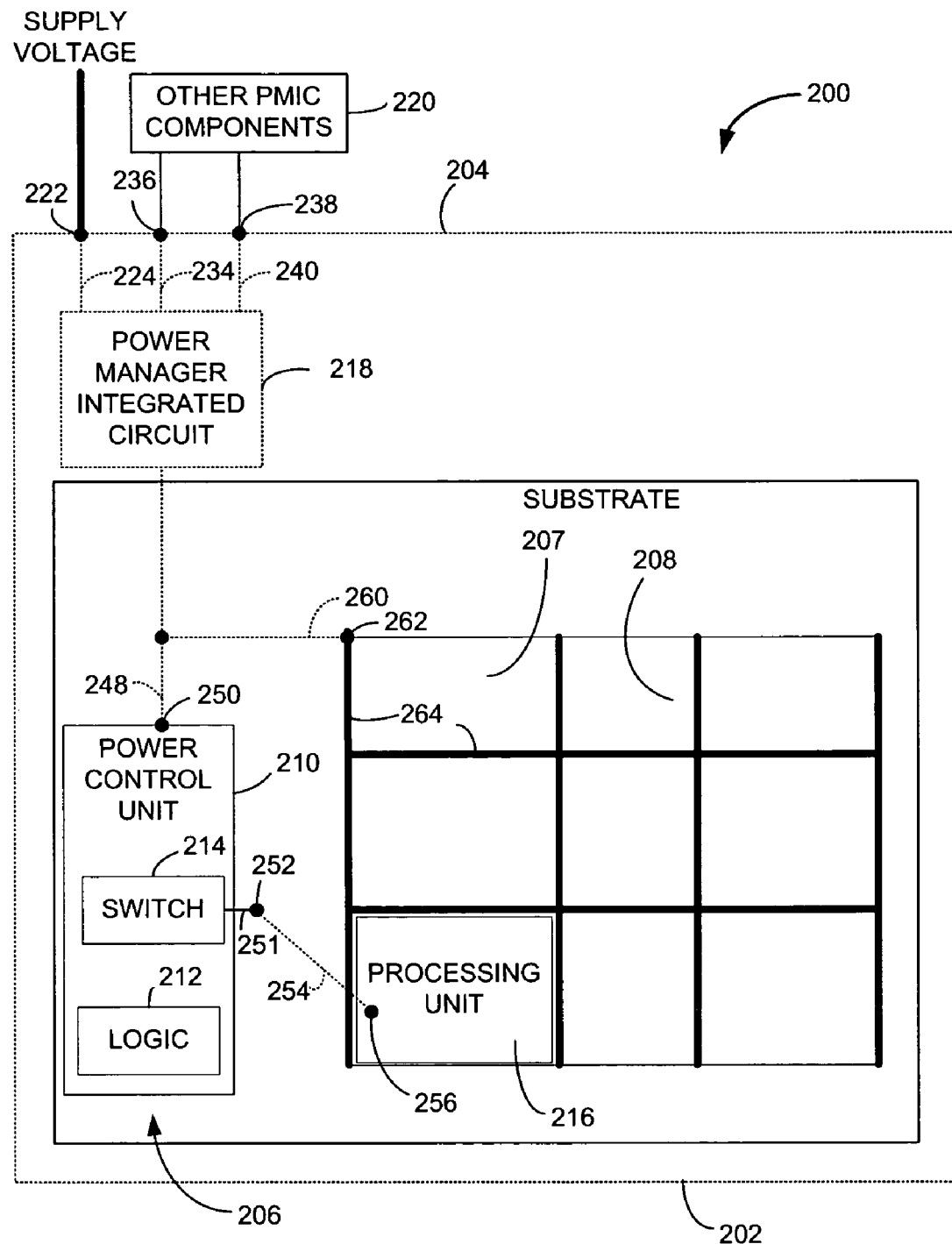
FIG. 2 is a block diagram illustrating a particular embodiment of an integrated circuit device including a package with a power management integrated circuit and a substrate with a switched power delivery system.

FIG. 2 is a block diagram illustrating a particular embodiment of an integrated circuit device 200 including a package 202 with a power management integrated circuit 218 and a substrate 204 with a switched power delivery system. In a particular embodiment, the package 202 may encapsulate the substrate 204. The block diagram is shown from a top view perspective through the package 202, and the components and traces of the package 202 are shown in phantom.

The package 202 includes a power manager integrated circuit 218. The substrate 204 includes a power control unit (PCU) 210 having logic 212 and a switch 214. The substrate 204 also includes a plurality of subdomains or isolated regions, such as subdomain 206 (including the PCU 210), subdomain 207, and subdomain 208. The substrate includes a processing unit 216 within a particular subdomain. The substrate 204 may also include one or more power grids, such as power grid 264.

The PMIC 218 receives a power supply voltage via package trace 224 from a package pin 222. The PMIC 218 may utilize other PMIC components 220, which may be off-chip or off-package to reduce the power supply voltage to a lower level for distribution to other integrated circuit components, to smooth or rectify the power supply voltage, and the like. The PMIC 218 may be connected to the other PMIC components via package trace 234, package pin 236, package pin 238 and package trace 240. The PMIC 218 may also be connected to the power grid 264 by package trace 260 and bump 262. The PMIC 218 is connected to the PCU 210 via a package trace 248 and a bump 250, which may be connected to a local power supply terminal or substrate trace (not shown) of the PCU 210. The switch 212 includes an output 251 coupled to bump 252, which is connected to a trace (or metallization portion) 254 of the package 202. The trace 254 is coupled to a bump 256 within a subdomain associated with the processing unit 216.

In operation, logic 212 selectively activates the switch 214 to deliver a power supply voltage to the processing unit 216 via the output 251, the bump 252, the package trace 254, and the bump 256. Thus, the PCU 210 via the logic 212 and the switch 214 selectively routes power to the processor 216, which may be a digital signal processor, an advanced reduced instruction set computing (RISC) machine (ARM) processor, a general purpose processor, an analog signal processor, or any combination thereof. Alternatively, the particular subdomain may include some other electrical component, such as a memory, another switch, a controller, and the like.

It should be understood that typically wire resistance in the traces of the substrate are high. This high resistance may be used to achieve the desired on-impedance of the switch 214. To prevent loss and heat dissipation, the PCU 210 utilizes a large percentage of the metal resources of the substrate 204 to deliver current to the switch 214 and then to deliver the current back to the package 202 when the switch 214 is activated by the logic 212. The PCU 210 may need to be placed in an area of the substrate 204 with few wire routes, since the PCU 210 may consume up to one hundred percent of the metallization up to the top layer metal of the substrate 204 and most of the top layer metal as well. In some embodiments, the PCU 210 may include bumps to connect to the PMIC 218, for example. These bumps, such as bump 250 may be exposed to electrostatic discharge (ESD) events. Accordingly, in some instances, it may be desirable to include additional ESD protection for the PCU 210. Alternatively, the switch 214 may be connected to processing unit 216, for example, via a wire trace (not shown) on the substrate 204 in parallel to the trace 254 of the package 202 to deliver power via both the package 202 and the substrate 204 to the particular power domain.

Figure 3:
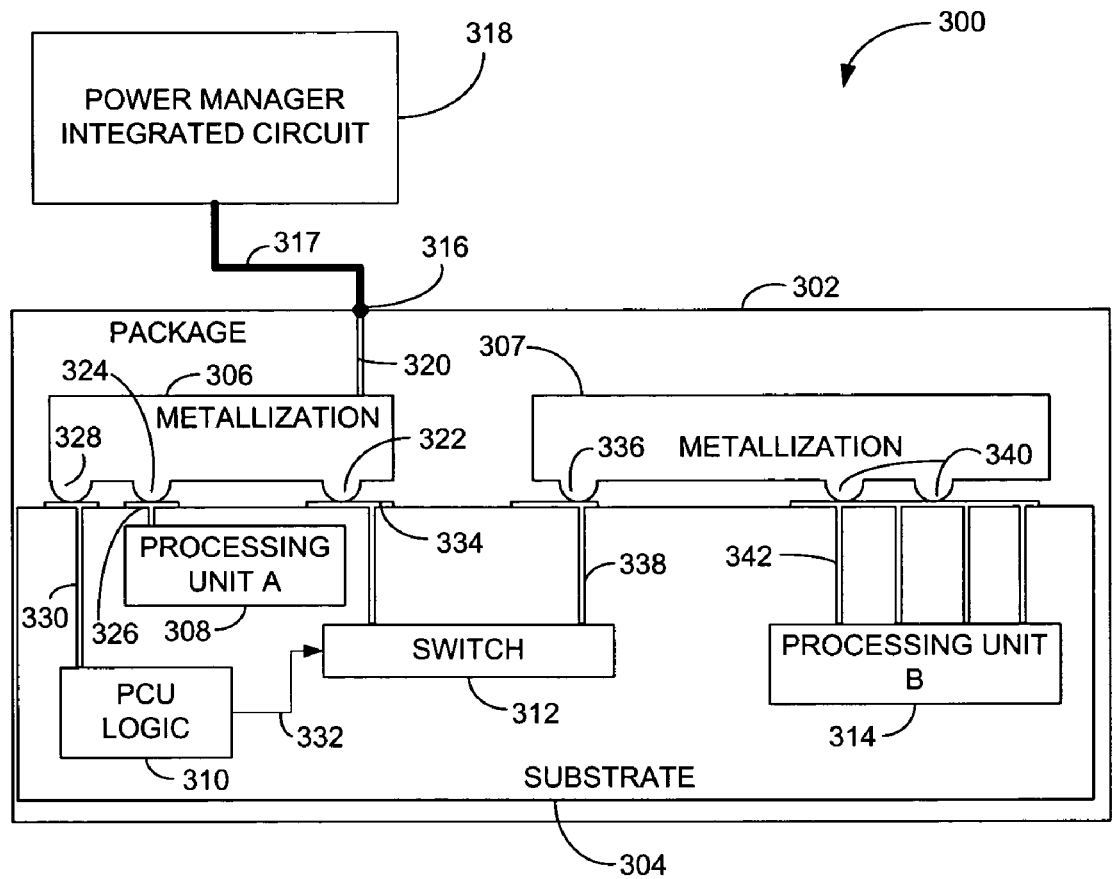
FIG. 3 is a cross-sectional view of an integrated circuit including a substrate and a flip-chip package.

FIG. 3 is a cross-sectional view of a circuit 300 including a flip-chip package 302 and a substrate 304, where the package 302 encapsulates the substrate 304. The circuit 300 also includes a PMIC 318. The package 302 includes metallization portions 306 and 307. The substrate 304 includes a processing unit 308, power control unit (PCU) logic 310, a switch 312, and a processing unit 314. The PMIC 318 is connected to the package 302 via pin 316 and interconnect 317. The pin 316 is coupled to the metallization 306 by trace 320. The package 302 is physically and electrically connected to the substrate 304 via representative bumps 322, 324, 328, 336 and 340. The bump 324 couples the metallization 306 of the package 302 to the processing unit 308 via the trace 326. The bump 328 couples the metallization 306 of the package 302 to the PCU logic 310 via trace 330. The bump 322 couples the metallization 306 of the package 302 to the switch 312 via trace 334. The switch 312 is connected to the metallization 307 of the package 302 via the bump 336 and the trace 338 that is coupled to the bump 336. The bumps 340 couple the metallization 307 of the package 302 to the processing unit 314 via traces 342.

In operation, the PMIC 318 delivers power to the package via pin 316, which provides the power to the metallization 306 via trace 320. The processing unit 308 derives power from the metallization via bump 324 and wire trace 326. The processing unit 308 may also provide a control signal such as a power enable signal to the PCU logic 310 to activate the switch 312. The PCU logic 310 may selectively activate the switch 312 to switch power from the metallization 306 via bump 322 and trace 334 through the switch 312 and to the metallization 307 via the bump 336 and the trace 338. The metallization 307 may then provide power to a subdomain of the substrate 304, which includes the processing unit 314. In this manner, power may be selectively routed via the metallization 306 and the metallization 307 of the package 302 to provide power to a particular subdomain, to a particular component, or a combination thereof.

It will be understood by a worker skilled in the art that the PMIC 318 may be a second package electrically and physically coupled to the package 302. Alternatively, the PMIC 318 may be electrically and physically coupled to the substrate 304 and may be connected to a pin of the package 302 via the substrate 304.

Figure 4:
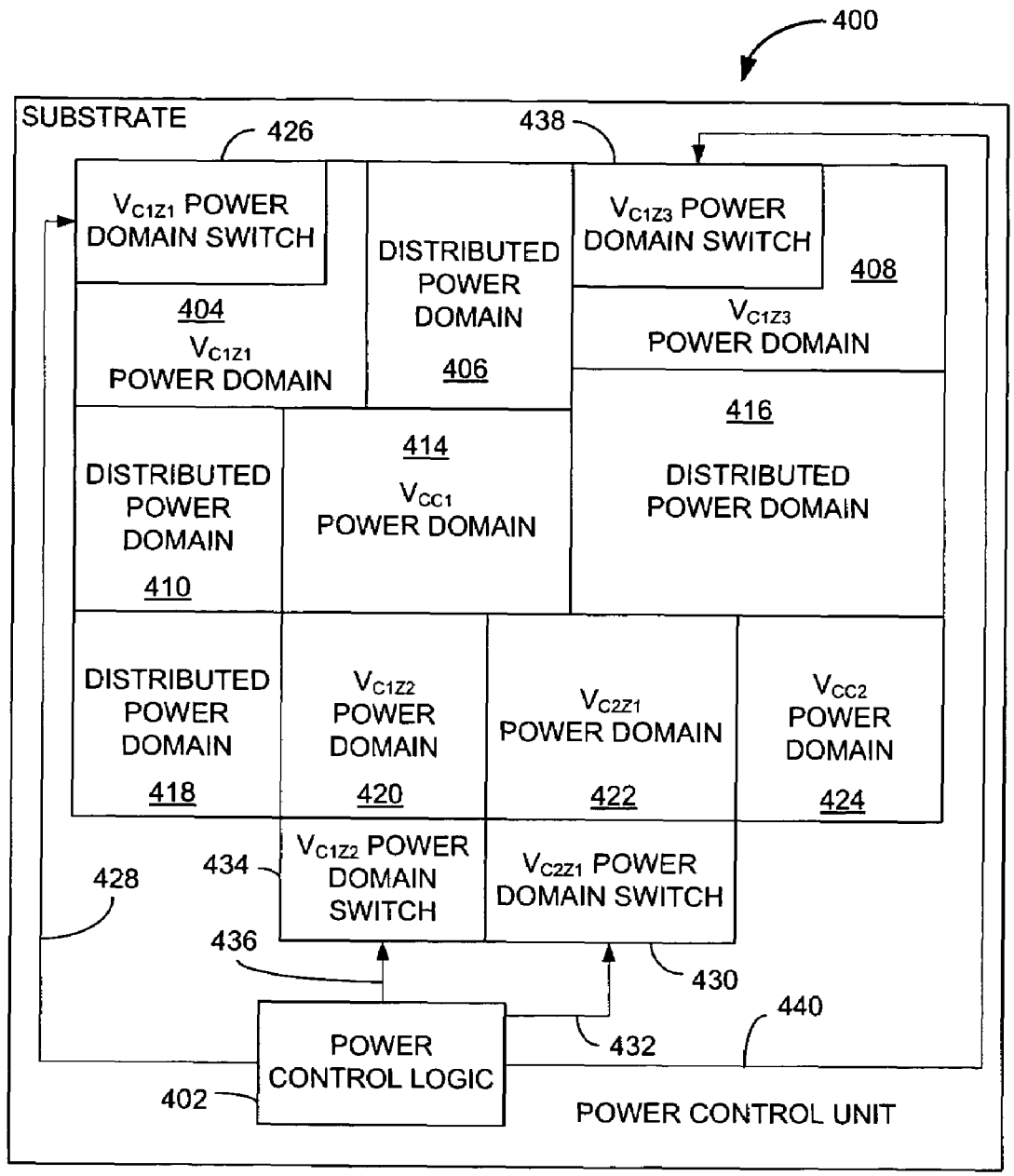
FIG. 4 is a block diagram illustrating a particular embodiment of a substrate including a plurality of electrically isolated power domains.

FIG. 4 is a block diagram illustrating a particular embodiment of a substrate 400 including a plurality of electrically isolated power domains. The substrate 400 includes power control logic 402, a power domain $V_{C1Z1}$ 404, a distributed power domain 406, a power domain $V_{C1Z3}$ 408, a distributed power domain 410, a power domain $V_{CC1}$ 414, distributed power domains 416 and 418, a power domain $V_{C1Z2}$ 420, a power domain $V_{C2Z1}$ 422, and a power domain $V_{CC2}$ 424. Additionally, the substrate includes a power domain switch $V_{C1Z1}$ 426, a power domain switch $V_{C2Z1}$ 430, a power domain switch $V_{C1Z2}$ 434 and a power domain switch $V_{C1Z3}$ 438, which are connected to the power control logic 402. The arrows 428, 432, 436 and 440 illustrate logical connections between the switches 226, 430, 434, and 438 and the power control logic 402.

In general, the distributed power domains 406, 410, 416, and 418 may include distributed switches (not shown) to switch between a power off state and a power on state, where either a power supply voltage ($V_{DD\_C1}$) or a power supply voltage ($V_{DD\_C2}$) is provided to the particular domain, for example. By contrast, the power domains 404, 408, 420 and 422 receive a power supply voltage via an adjacent switch 426, 438, 434, or 430, respectively, such as the switches described with respect to FIGS. 1-3. The power control logic 402 is adapted to activate and to deactivate the switches 426, 438, 434, and 430. The power domain 414 may have no switch and may derive power from the supply voltage terminal $V_{CC1}$.

In operation, power domain $V_{CC1}$ 414 receives a power supply voltage from a power manager integrated circuit (PMIC), such as that shown in FIGS. 1-3. The power domain $V_{CC1}$ 414 provides a power supply voltage to the power domain switch $V_{C1Z1}$ 426, to the power domain switch $V_{C1Z2}$ 434, and to the power domain switch $V_{C1Z3}$ 438. The power control logic 402 may selectively activate the power domain switch $V_{C1Z1}$ 426, the power domain switch $V_{C1Z2}$ 434, the power domain switch $V_{C1Z3}$ 438, or any combination thereof to deliver power a switched power supply voltage ($V_{DD\_C1Z1}$, $V_{DD\_C1Z2}$, of $V_{DD\_C1Z3}$) to the respective local power domain according to control signals sent via logical connections 428, 436 and/or 440 from the PCU 402. Similarly, power domain $V_{CC2}$ 424 receives a power supply voltage from the PMIC and provides a switched power supply voltage (VDD_C2Z1) to the power domain switch $V_{C2Z1}$ 430. The power control logic 402 may selectively activate or deactivate the power domain switch $V_{C2Z1}$ 438 via the logical connection 432 to deliver power to the power domain $V_{C2Z1}$ 408.

If, as shown, the power domain switches 426, 438, 434, and 430 are adjacent to the power domain within the substrate 400, it may be desirable to route power via the substrate in parallel to the package routing.

In general, by utilizing the package to distribute power, the circuits that generate switched supply power are free to use the on-silicon metal resources. The load circuit, such as a processor, may utilize the global silicon power distribution network without the need to generate the switched supply in the same substrate area. This provides an advantage in that approximately 3% to 8% of the silicon overhead is removed from the load circuit, reducing the total power demand of the load circuit. Moreover, by centralizing the power control and by removing the switches from the load circuit, component placement on the chip is simplified, since it is no longer necessary to route input power to at least some of the components. Moreover, it is no longer necessary to route multiple power grids over and around the distributed switch circuit. Moreover, it is not necessary to dedicate metal resources of the substrate to the generation of the switched supply.

Another advantage, which is provided by routing power through the package, includes decoupling of the circuit designs. Since the switch circuit need only provide for the current that the load circuit requires, rather than a peak charge density multiplied by the area of the load circuit, the switch can be constructed of thicker oxide devices that have lower current leakage and that operate at higher voltage levels. Additionally, the load circuit can be designed for performance without having to engineer a power switch into the design to reduce standby power.

Yet another advantage is that the peak demand of the total load circuit is lower than the peak power density multiplied by a substrate area of the load circuit. Accordingly, while a distributed switch must be designed to meet the peak power density per unit area, the concentrated supply switch must meet the peak demand of the entire load circuit. The peak demand of the entire load circuit may be on an order of ½ to ⅓rd of the peak power density multiplied by the area of the load. Therefore, the size of the switch can be reduced by the same order of magnitude, while maintaining the voltage loss of the distributed switches.

Still another advantage is that the current used to cycle the power switch can be reduced and better managed, since the physical size of the switch can be reduced to a fraction of the size of the distributed switch. In one particular embodiment, the switch is reduced in size to approximately ½ to ¼th of the sum of the area of the distributed switches, while the interconnect/control of the distributed switch is routed to an area that is 20 to 40 times larger than the area of the concentrated switch.

Figure 5:
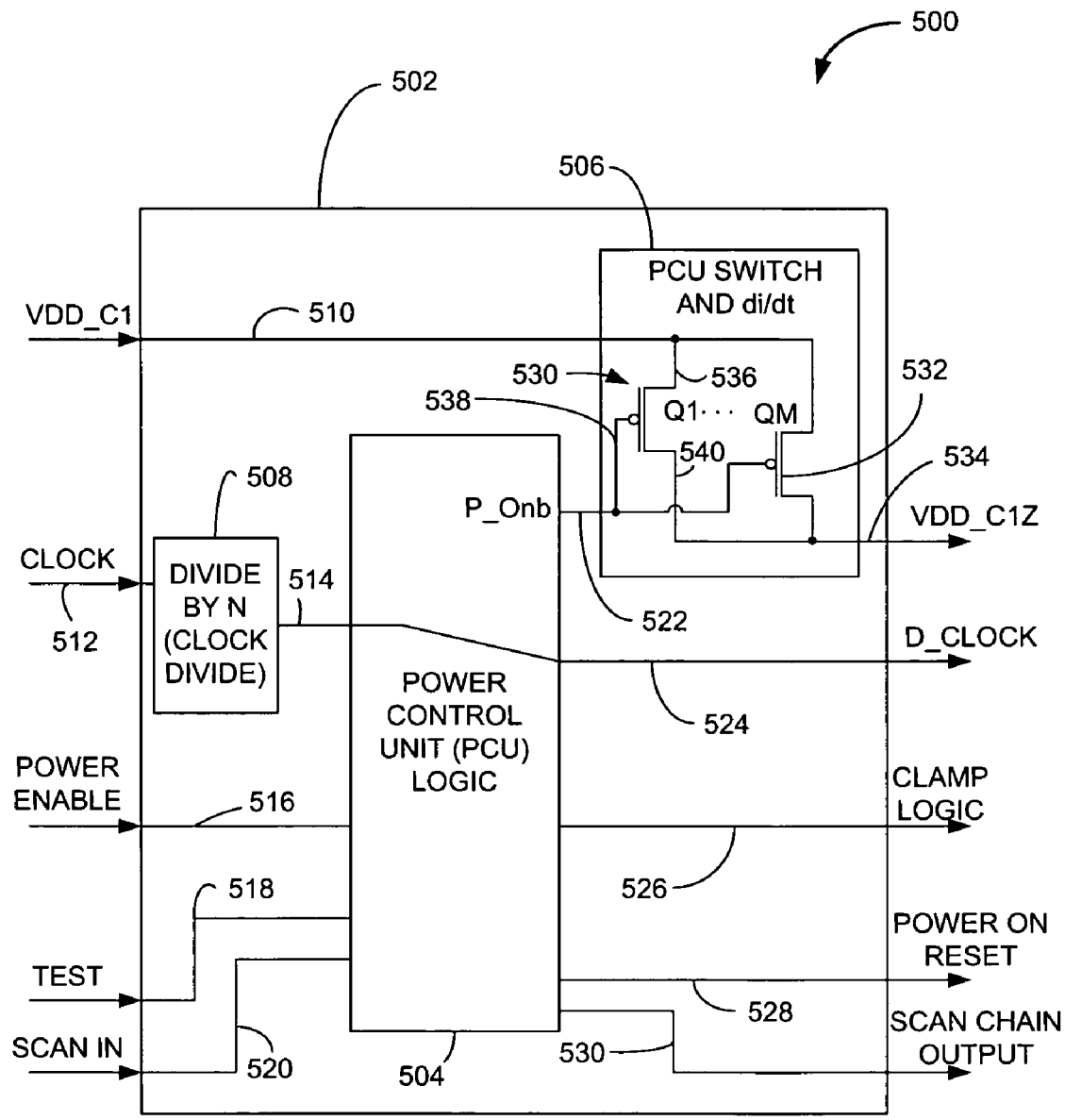
FIG. 5 is a block diagram illustrating a particular embodiment of a power management system.

FIG. 5 is a block diagram illustrating a particular embodiment of a power management system 500. The power management system 500 includes a power control unit (PCU) 502 including PCU logic 504, a PCU switch 506, and a clock divider 508. The clock divider 508 may be a divide by N clock as shown or may be a delay select device to provide a delayed version of a clock signal to the PCU logic 504. Alternatively, the PCU 504 may be self-timed, in which case the clock divider 508 may be omitted.

The PCU 502 includes a power supply voltage terminal 510, a clock terminal 512, a power enable input terminal 516, a test terminal 518, and a scan chain input terminal 520. The power supply voltage terminal 510 is coupled to the PCU switch 506. The clock terminal 512 is connected to the clock divider 508, which includes an output 514 to provide a divided clock signal (D_clock) to the PCU 504 and to an output terminal 524. The power enable terminal 516, the test terminal 518 and the scan chain input terminal 520 are connected to the PCU logic 504. The test input terminal 518 provides a mode setting input to place the PCU logic 504 in a test mode and the scan chain input terminal 520 allows a circuit designer to provide test signals to test the logic 504. Additionally, the test terminal 518 and the scan chain input terminal 520 may be utilized to configure the PCU logic 504.

The PCU switch 506 includes one or more p-channel transistors (1-M) 530 and 532 arranged in parallel. The p-channel transistor 530, for example, includes a first terminal 536, a control terminal 538, and a second terminal 540. The first terminal 536 is connected to the power supply terminal 510. The control terminal 538 is connected to the power on enable terminal 522 of the PCU logic 504. The second terminal 540 is connected to the power supply output terminal 534. The p-channel transistors 530 and 532 may be bi-polar junction transistors, field-effect transistors, insulated-gate field-effect transistors, and the like. The PCU logic 504 includes a power on enable output 522 to selectively activate each of the one or more transistors 530 and 532 to provide a power supply voltage to the power supply output terminal 534, which may be, for example, the supply voltage $V_{DD\_C1Z}$ for a power domain, such as the power domain $V_{C1Z1}$ in FIG. 4. In general, the logic 504 may selectively activate the transistors of the PCU switch 506 in stages to produce a ramp output voltage ($V_{DD\_C1Z}$) at the power supply output terminal 534.

In operation, the PCU logic 504 receives a power enable signal at the power enable signal terminal 516. The power enable signal may be a logic "1" or a logic high value stored in a configuration register, such as the configuration register 132 in FIG. 1. Alternatively, the power enable signal may be received directly from a component within a power domain of the substrate. In another embodiment, the power enable signal may be received from an input pin of a package coupled to the substrate. In response to receiving the power enable signal, the PCU logic 504 generates a power on signal on the power on enable output terminal 522 to activate the transistors 530 through 532 in stages, or in some particular order sequentially to generate the output supply voltage $V_{DD\_C1Z}$ on the output terminal 534.

In general, the PCU switch 506 includes a plurality of p-channel transistors (1-M) arranged in parallel, which can be activated independently. By activating each of the plurality of p-channel transistors in stages, where each stage includes at least one p-channel transistor, the output supply voltage can be increased gradually like a ramp signal, to a desired level of granularity. Since each p-channel transistor and each interconnect introduces parasitic capacitances, the transistors may be activated in stages to limit the current ramp by charging the $V_{DD\_C1Z}$ capacitance gradually.

The PCU logic 504 may assert a power on reset signal at the power on reset terminal 528 to reset the associated power domain before beginning processing by a processor of the associated power domain. Additionally, while the PCU 504 is inactive or while asserting the power on reset signal, the PCU logic 504 may assert an output clamp signal on the output clamp terminal to activate clamp logic (not shown) to force the outputs of the associated power domain to a known logic state to prevent floating inputs to other power domains. In a particular embodiment, the clamp logic to force the outputs to a known logic state is powered by the power domain that receives the output clamp signal as an input.

Figure 6:
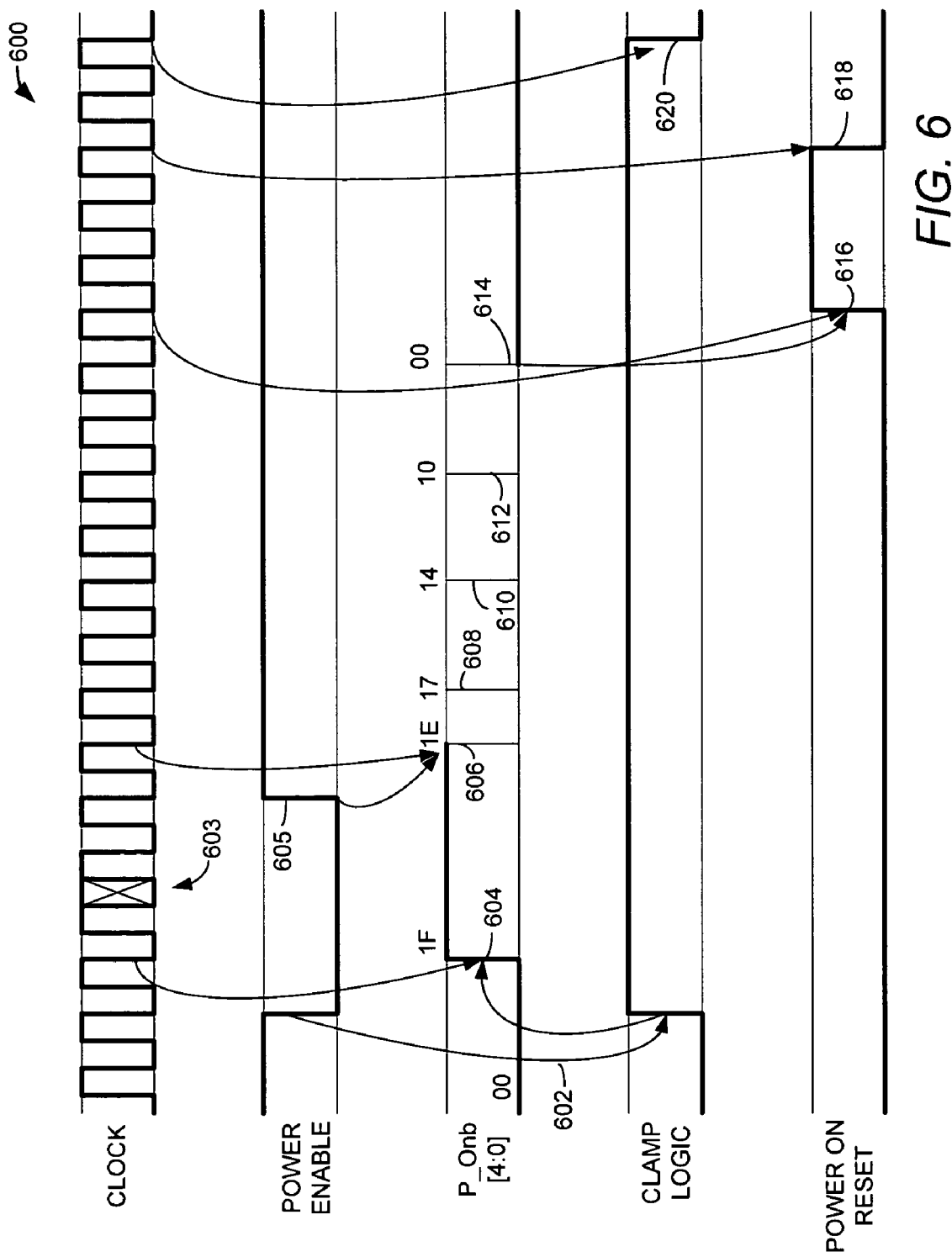
FIG. 6 is a timing diagram illustrating several of the signals of the power management system of FIG. 5.

FIG. 6 is a timing diagram 600 illustrating several of the signals of the power management system of FIG. 5. The timing diagram 600 includes a clock signal, a power enable signal, a power on enable signal, a clamp logic signal, and a power on reset signal. In this particular example, initially the power enable signal is at a logic high level, and the power on enable signal, the logic clamp signal, and the power on reset signal are at a logic low level.

In this example, on the falling edge of the second clock cycle, the power enable signal at the power enable input terminal 516 changes from a logic high level to a logic low level. In response, the PCU logic 504 concurrently changes the clamp logic signal on the clamp logic output terminal from a logic low level to a logic high level as indicated by reference numeral 602. On a falling edge of the next clock cycle, the PCU logic 504 changes the power on enable signal from a logic low level to a logic high level at reference numeral 604, turning off the power to the output $V_{DD\_C1Z}$ in FIG. 5, for example. After one or more clock cycles, the power enable signal at the power enable input terminal 516 reverts back to a logic low level, as indicated at reference numeral 605. In general, the clock cycle indicated at 603 may include a plurality of clock cycles, depending on the particular implementation. On a falling edge of the next clock cycle, the power on enable signal on the power on enable terminal 522 is decreased by a small amount to activate the p-channel transistors one at a time or in stages. The decreases is indicated by reference numeral 606, because at least one of the transistors of the PCU switch 506 in FIG. 5 is activated. Over a number of clock cycles, the logic level of the power on enable signal is gradually decreased by activating the transistors of the PCU switch 506 in stages to step down the logic voltage level at stages 608, 610, 612, and 614 until the logic voltage level is returned to a logic low voltage level. On a falling edge of the next clock cycle (at 616), the PCU logic 504 switches a power on reset signal from a logic low level to a logic high level. The logic high level of the power on reset signal is held for several clock cycles to reset the $V_{DD\_C1Z}$ domain. After several clock cycles, the PCU logic 504 allows the power on reset signal to fall to a logic low level (at reference numeral 618). Subsequently, the PCU logic 504 decreases the clamp logic signal from a logic high level to a logic low level (at reference numeral 620). At this stage, the PCU logic 504 has fully activated the switch 506 to deliver power via the package metallization to a selected power domain.

In general, the PCU logic 504 can control how quickly to activate the switch by altering the number of stages and/or the number of cycles between stages. In Verilog code in a circuit design compiler application, the ramped control of the switch 506 may be reflected as a hexadecimal value. For example, initially, the hexadecimal value of the power on enable signal is "00." At 604, the value of the power on enable signal may increase to a value of "1F," then decrease in stages from 1F to 1E, from 1E to 17, from 17 to 14, from 14 to 10, and from 10 to 00, for example, at 606, 608, 610, 612 and 614, respectively. The number of transistors in the switch 504 determines the granularity of the step down for the power on signal. For example, a switch that includes sixteen p-channel transistors may provide sixteen stages in the signal. By contrast, the sixteen p-channel transistors may be selectively activated in sets of four transistors to provide four stages to the ramped signal. Any number of p-channel transistors may be provided in the switch, depending on the particular implementation.

In general, integrated circuits (ICs) may be assembled into electronic packages, and one or more IC packages can be physically and electrically coupled to produce an electronic assembly. The electronic assembly may be incorporated into various electronic devices, including but not limited to computing devices (such as desktop computers, portable computers, personal digital assistants, hand-held devices, server devices, and the like), wireless communications devices (such as cellular phones, digital phones, pagers, and the like), peripheral devices (such as printers, scanners, monitors, digital cameras), display devices (such as televisions, computer displays, liquid crystal displays (LCDs), and the like), or any combination thereof.

Figure 7:
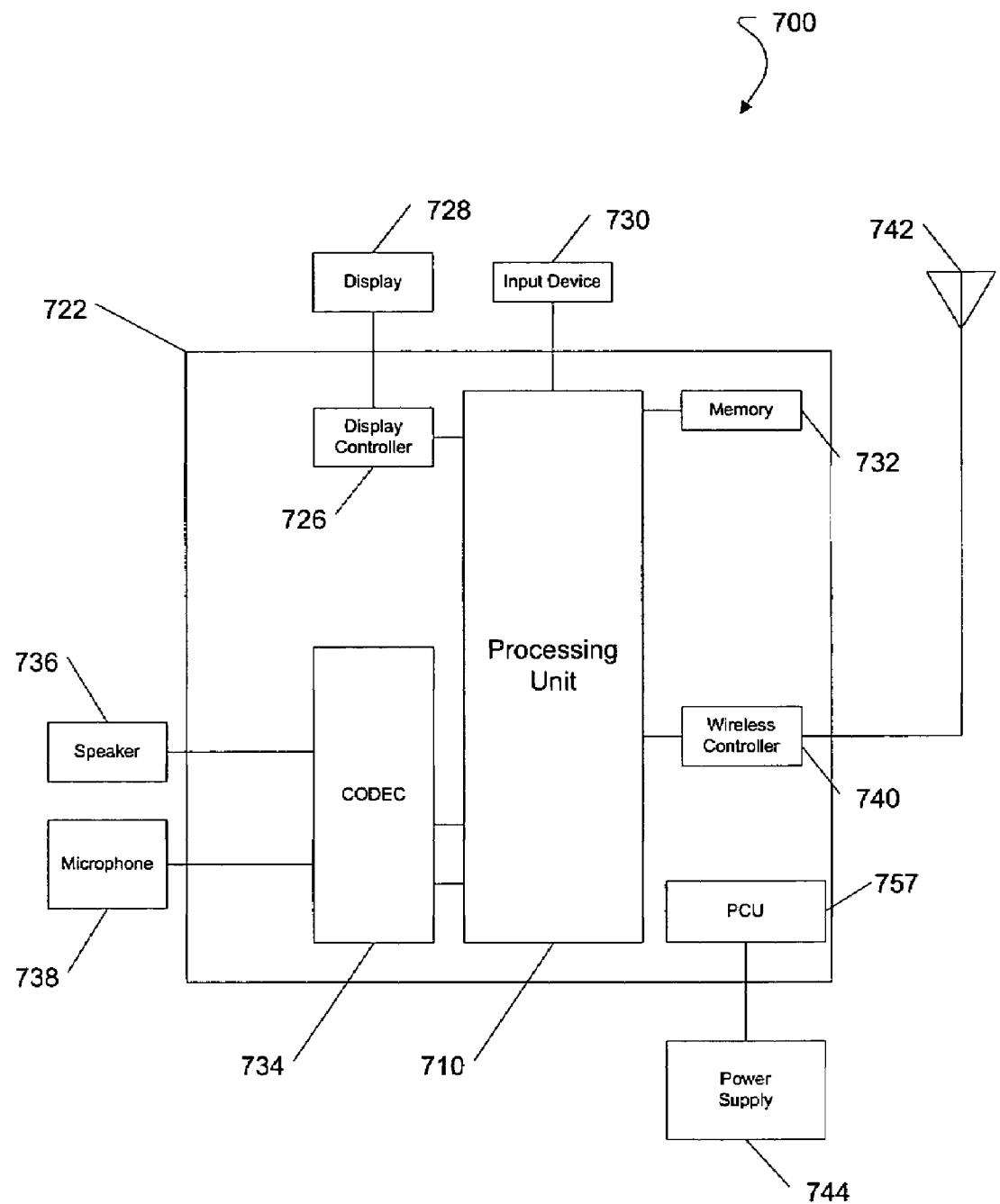
FIG. 7 is a general diagram of an exemplary cellular telephone incorporating a processor and a memory in which the system and method of FIGS. 1-5 may be used.

FIG. 7 illustrates an exemplary, non-limiting embodiment of a portable communication device that is generally designated 700. As illustrated in FIG. 7, the portable communication device includes an on-chip system 722 that includes a processing unit 710, which may be general purpose processor, a digital signal processor, an advanced reduced instruction set machine processor, or any combination thereof. FIG. 7 also shows a display controller 726 that is coupled to the processing unit 710 and a display 728. Moreover, an input device 730 is coupled to the processing unit 710. As shown, a memory 732 is coupled to the processing unit 710. Additionally, a coder/decoder (CODEC) 734 can be coupled to the processing unit 710. A speaker 736 and a microphone 738 can be coupled to the CODEC 730. In a particular embodiment, the processing unit 710, the display controller 726, the memory 732, the CODEC 734, other components, or any combination thereof may receive power via off-substrate package metallization from a switched power supply via a power control unit 757, such as that shown in FIGS. 1-5 and described herein.

FIG. 7 also indicates that a wireless controller 740 can be coupled to the processing unit 710 and a wireless antenna 742. In a particular embodiment, a power supply 744 is coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each is coupled to a component of the on-chip system 722.

In a particular embodiment, the processing unit 710 may process instructions associated with programs necessary to perform the functionality and operations needed by the various components of the portable communication device 700. For example, when a wireless communication session is established via the wireless antenna a user can speak into the microphone 738. Electronic signals representing the user's voice can be sent to the CODEC 734 to be encoded. The processing unit 710 can perform data processing for the CODEC 734 to encode the electronic signals from the microphone. Further, incoming signals received via the wireless antenna 742 can be sent to the CODEC 734 by the wireless controller 740 to be decoded and sent to the speaker 736. The processing unit 710 can also perform the data processing for the CODEC 734 when decoding the signal received via the wireless antenna 742.

Further, before, during, or after the wireless communication session, the processing unit 710 can process inputs that are received from the input device 730. For example, during the wireless communication session, a user may be using the input device 730 and the display 728 to surf the Internet via a web browser that is embedded within the memory 732 of the portable communication device 700. Many of the instructions associated with a program may be executed concurrently during one or more clock cycles. The portable communications device 700 may include a power control unit 757 coupled to the power supply 744 to selectively activate power via off-substrate package metallization to one or more of the other components, such as that described above with respect to FIGS. 1-6.

Figure 8:
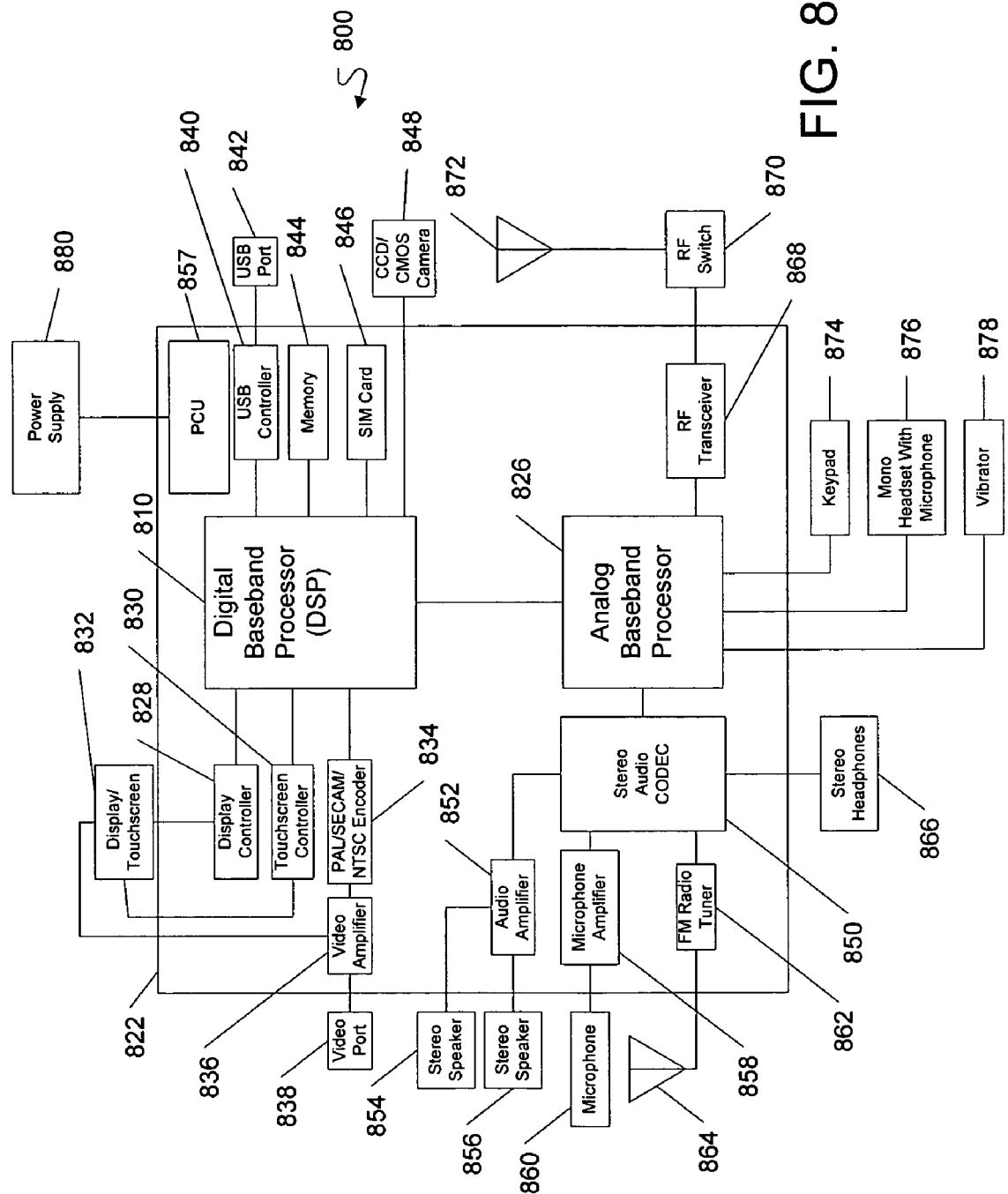
FIG. 8 is a general diagram of an exemplary wireless Internet Protocol telephone incorporating a processor and a memory in which the system and method of FIGS. 1-5 may be used.

Referring to FIG. 8, an exemplary, non-limiting embodiment of a wireless telephone is shown and is generally designated 800. As shown, the wireless telephone 800 includes an on-chip system 822 that includes a digital baseband processor 810 and an analog baseband processor 826 that are coupled together. The wireless telephone 800 may alternatively include a general-purpose processor that is adapted to execute processor readable instructions to perform digital or analog signal processing, as well as other operations. As illustrated in FIG. 8, a display controller 828 and a touchscreen controller 830 are coupled to the digital baseband processor 810. In turn, a touchscreen display 832 external to the on-chip system 822 is coupled to the display controller 828 and the touchscreen controller 830. In a particular embodiment, the digital baseband processor 810, the analog baseband processor 826, the display controller 828, the touchscreen controller 830, other components, or any combination thereof may receive power via off-substrate package metallization from a switched power supply via a power control unit 857, such as that shown in FIGS. 1-5 and described herein.

FIG. 8 further indicates that a video encoder 834, e.g., a phase alternating line (PAL) encoder, a sequential couleur avec memoire (SECAM) encoder, or a national television system(s) committee (NTSC) encoder, is coupled to the digital baseband processor 810. Further, a video amplifier 836 is coupled to the video encoder 834 and the touchscreen display 832. Also, a video port 838 is coupled to the video amplifier 836. As depicted in FIG. 8, a universal serial bus (USB) controller 840 is coupled to the digital baseband processor 810. Also, a USB port 842 is coupled to the USB controller 840. A memory 844 and a subscriber identity module (SIM) card 846 can also be coupled to the digital baseband processor 810. Further, as shown in FIG. 8, a digital camera 848 can be coupled to the digital baseband processor 810. In an exemplary embodiment, the digital camera 848 is a charge-coupled device (CCD) camera or a complementary metal-oxide semiconductor (CMOS) camera.

As further illustrated in FIG. 8, a stereo audio CODEC 850 can be coupled to the analog baseband processor 826. Moreover, an audio amplifier 852 can coupled to the to the stereo audio CODEC 880. In an exemplary embodiment, a first stereo speaker 854 and a second stereo speaker 856 are coupled to the audio amplifier 852. FIG. 8 shows that a microphone amplifier 858 can be also coupled to the stereo audio CODEC 850. Additionally, a microphone 860 can be coupled to the microphone amplifier 858. In a particular embodiment, a frequency modulation (FM) radio tuner 862 can be coupled to the stereo audio CODEC 850. Also, an FM antenna 864 is coupled to the FM radio tuner 862. Further, stereo headphones 866 can be coupled to the stereo audio CODEC 850.

FIG. 8 further indicates that a radio frequency (RF) transceiver 868 can be coupled to the analog baseband processor 826. An RF switch 870 can be coupled to the RF transceiver 868 and an RF antenna 872. As shown in FIG. 8, a keypad 874 can be coupled to the analog baseband processor 826. Also, a mono headset with a microphone 876 can be coupled to the analog baseband processor 826. Further, a vibrator device 878 can be coupled to the analog baseband processor 826. FIG. 8 also shows that a power supply 880 can be coupled to the on-chip system 822. In a particular embodiment, the power supply 880 is a direct current (DC) power supply that provides power to the various components of the wireless telephone 800 that require power. Further, in a particular embodiment, the power supply is a rechargeable DC battery or a DC power supply that is derived from an alternating current (AC) to DC transformer that is connected to an AC power source.

In a particular embodiment, as depicted in FIG. 8, the touchscreen display 832, the video port 838, the USB port 842, the camera 848, the first stereo speaker 854, the second stereo speaker 856, the microphone 860, the FM antenna 864, the stereo headphones 866, the RF switch 870, the RF antenna 872, the keypad 874, the mono headset 876, the vibrator 878, and the power supply 880 are external to the on-chip system 822. The wireless telephone 800 may include a power control unit 857 coupled to the power supply 880 to selectively activate power via off-substrate package metallization to one or more of the other components, such as that described above with respect to FIGS. 1-6.

Figure 9:
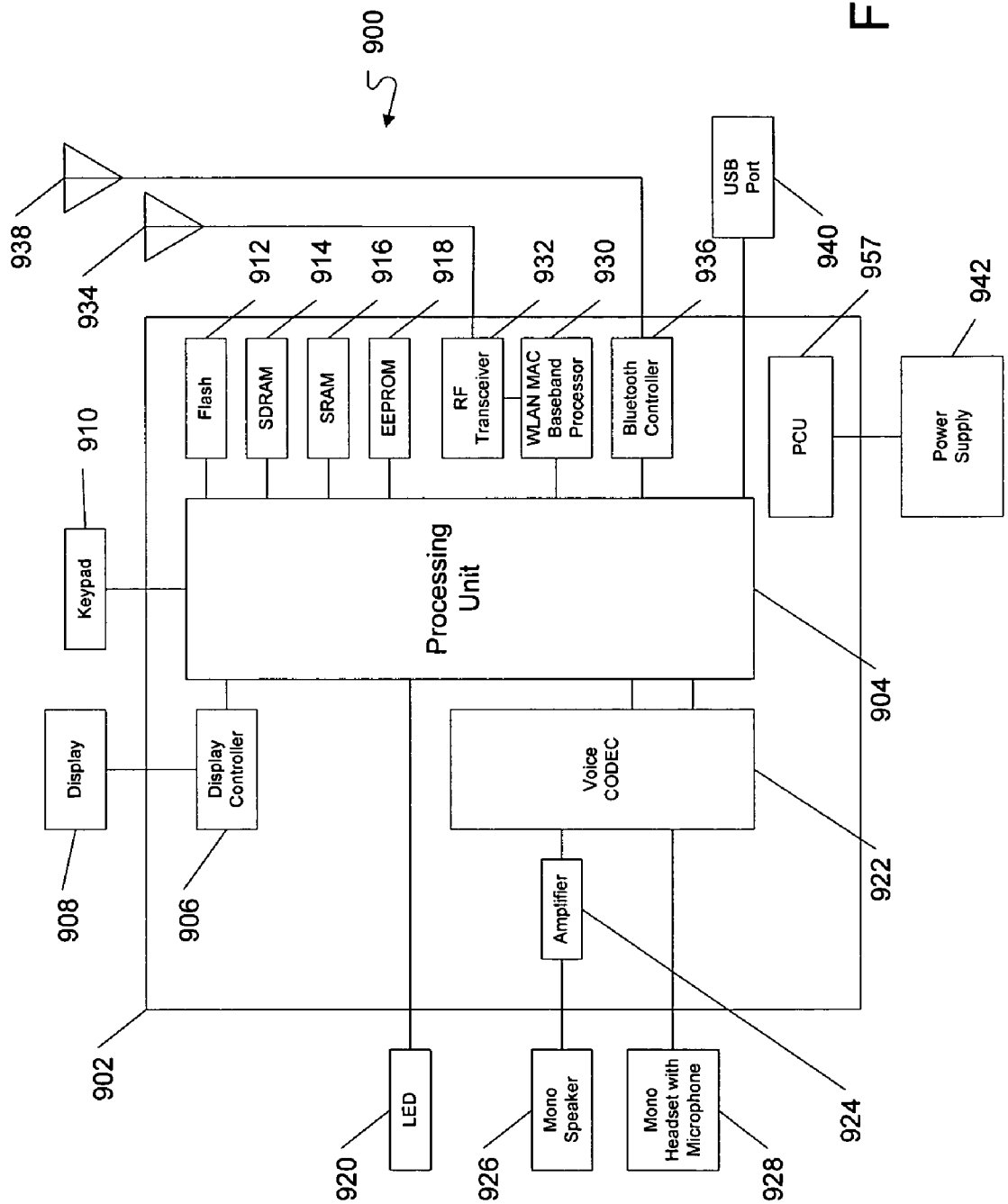
FIG. 9 is a general diagram of an exemplary portable digital assistant incorporating a processor and a memory in which the system and method of FIGS. 1-5 may be used.

Referring to FIG. 9, an exemplary, non-limiting embodiment of a wireless Internet protocol (IP) telephone is shown and is generally designated 900. As shown, the wireless IP telephone 900 includes an on-chip system 902 that includes a processing unit 904. The processing unit 904 may be a digital signal processor, a general purpose processor, an advanced reduced instruction set computing machine processor, an analog signal processor, a processor to execute processor readable instruction sets, or any combination thereof. As illustrated in FIG. 9, a display controller 906 is coupled to the processing unit 904 and a display 908 is coupled to the display controller 906. In an exemplary embodiment, the display 908 is a liquid crystal display (LCD). FIG. 9 further shows that a keypad 910 can be coupled to the processing unit 904. In a particular embodiment, the processing unit 904, the display controller 906, other components, or any combination thereof may receive power via off-substrate package metallization from a switched power supply via a power control unit 957, such as that shown in FIGS. 1-5 and described herein.

As further depicted in FIG. 9, a flash memory 912 can be coupled to the processing unit 904. A synchronous dynamic random access memory (SDRAM) 914, a static random access memory (SRAM) 916, and an electrically erasable programmable read only memory (EEPROM) 918 can also be coupled to the processing unit 904. FIG. 9 also shows that a light emitting diode (LED) 920 can be coupled to the processing unit 904. Additionally, in a particular embodiment, a voice CODEC 922 can be coupled to the processing unit 904. An amplifier 924 can be coupled to the voice CODEC 922 and a mono speaker 926 can be coupled to the amplifier 924. FIG. 9 further indicates that a mono headset 928 can also be coupled to the voice CODEC 922. In a particular embodiment, the mono headset 928 includes a microphone.

FIG. 9 also illustrates that a wireless local area network (WLAN) baseband processor 930 can be coupled to the processing unit 904. An RF transceiver 932 can be coupled to the WLAN baseband processor 930 and an RF antenna 934 can be coupled to the RF transceiver 932. In a particular embodiment, a Bluetooth controller 936 can also be coupled to the processing unit 904 and a Bluetooth antenna 938 can be coupled to the controller 936. FIG. 9 also shows that a USB port 940 can also be coupled to the processing unit 904. Moreover, a power supply 942 is coupled to the on-chip system 902 and provides power to the various components of the wireless IP telephone 900 via the on-chip system 902.

In a particular embodiment, as indicated in FIG. 9, the display 908, the keypad 910, the LED 920, the mono speaker 926, the mono headset 928, the RF antenna 934, the Bluetooth antenna 938, the USB port 940, and the power supply 942 are external to the on-chip system 902. However, each of these components is coupled to one or more components of the on-chip system. The wireless VoIP device 900 may include a power control unit 957 coupled to the power supply 942 to selectively activate power to one or more of the other components via off-substrate metallization, such as that described above with respect to FIGS. 1-6.

Figure 10:
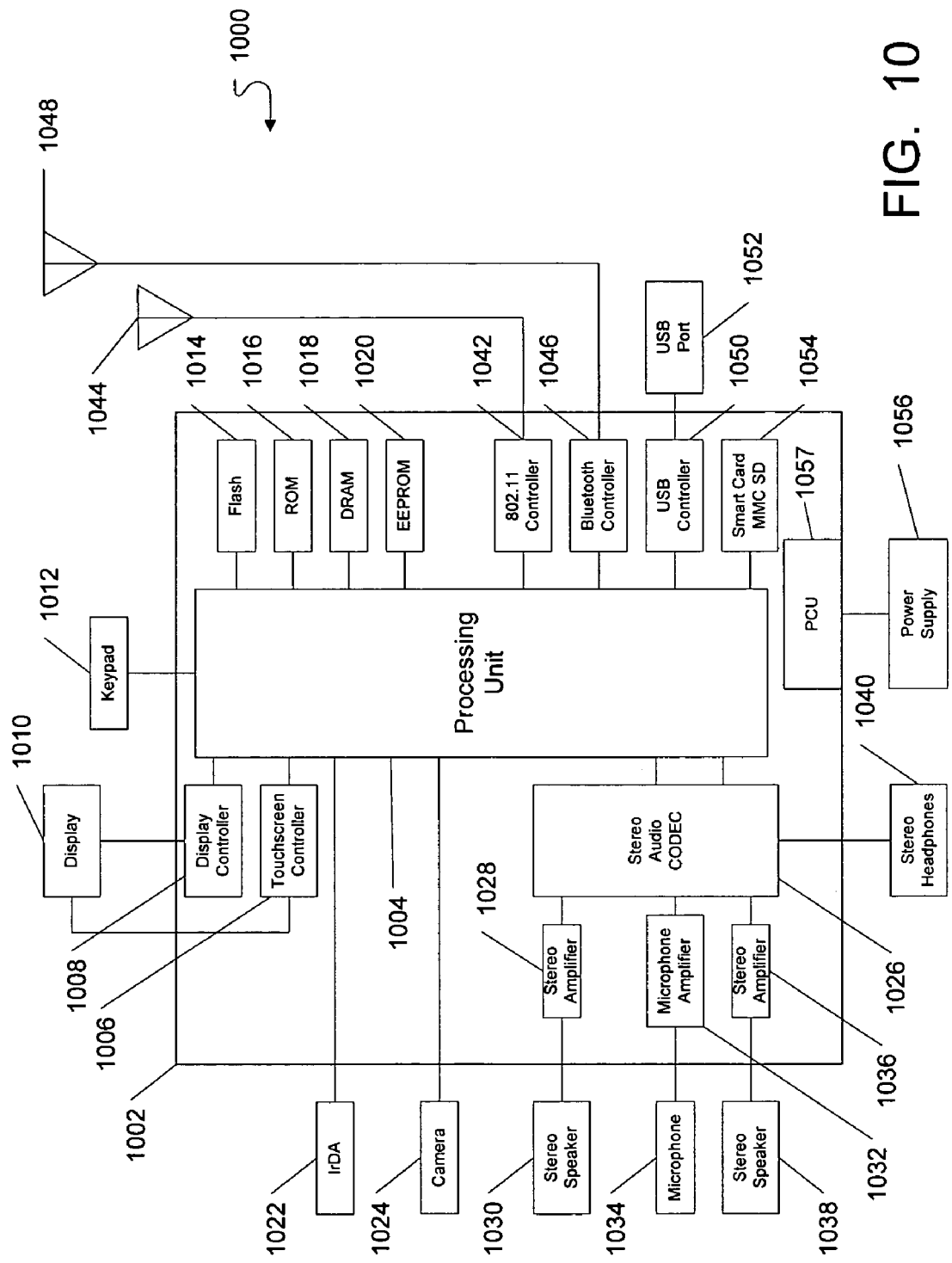
FIG. 10 is a general diagram of an exemplary audio file player incorporating a processor and a memory in which the system and method of FIGS. 1-5 may be used.

FIG. 10 illustrates an exemplary, non-limiting embodiment of a portable digital assistant (PDA) that is generally designated 1000. As shown, the PDA 1000 includes an on-chip system 1002 that includes a processing unit 1004. As depicted in FIG. 10, a touchscreen controller 1006 and a display controller 1008 are coupled to the processing unit 1004. Further, a touchscreen display 1010 is coupled to the touchscreen controller 1006 and to the display controller 1008. FIG. 10 also indicates that a keypad 1012 can be coupled to the processing unit 1004. In a particular embodiment, the processing unit 1004, the touchscreen controller 1006, the display controller 1008, other components, or any combination thereof may receive power via off-substrate package metallization from a switched power supply via a power control unit 1057, such as that shown in FIGS. 1-5 and described herein.

As further depicted in FIG. 10, a flash memory 1014 can be coupled to the processing unit 1004. The processing unit 1004 may be a digital signal processor (DSP), a general purpose processor, an advanced reduced instruction set computing machine, an analog signal processor, a processor adapted to execute processor readable instruction sets, or any combination thereof. Also, a read only memory (ROM) 1016, a dynamic random access memory (DRAM) 1018, and an electrically erasable programmable read only memory (EEPROM) 1020 can be coupled to the processing unit 1004. FIG. 10 also shows that an infrared data association (IrDA) port 1022 can be coupled to the processing unit 1004. Additionally, in a particular embodiment, a digital camera 1024 can be coupled to the processing unit 1004.

As shown in FIG. 10, in a particular embodiment, a stereo audio CODEC 1026 can be coupled to the processing unit 1004. A first stereo amplifier 1028 can be coupled to the stereo audio CODEC 1026 and a first stereo speaker 1030 can be coupled to the first stereo amplifier 1028. Additionally, a microphone amplifier 1032 can be coupled to the stereo audio CODEC 1026 and a microphone 1034 can be coupled to the microphone amplifier 1032. FIG. 10 further shows that a second stereo amplifier 1036 can be coupled to the stereo audio CODEC 1026 and a second stereo speaker 1038 can be coupled to the second stereo amplifier 1036. In a particular embodiment, stereo headphones 1040 can also be coupled to the stereo audio CODEC 1026.

FIG. 10 also illustrates that an 802.11 controller 1042 can be coupled to the processing unit 1004 and an 802.11 antenna 1044 can be coupled to the 802.11 controller 1042. Moreover, a Bluetooth controller 1046 can be coupled to the processing unit 1004 and a Bluetooth antenna 1048 can be coupled to the Bluetooth controller 1046. As depicted in FIG. 10, a USB controller 1050 can be coupled to the processing unit 1004 and a USB port 1052 can be coupled to the USB controller 1050. Additionally, a smart card 1054, e.g., a multimedia card (MMC) or a secure digital card (SD) can be coupled to the processing unit 1004. Further, as shown in FIG. 10, a power supply 1056 can be coupled to the on-chip system 1002 and can provide power to the various components of the PDA 1000 via the on-chip system 1002.

In a particular embodiment, as indicated in FIG. 10, the display 1010, the keypad 1012, the IrDA port 1022, the digital camera 1024, the first stereo speaker 1030, the microphone 1034, the second stereo speaker 1038, the stereo headphones 1040, the 802.11 antenna 1044, the Bluetooth antenna 1048, the USB port 1052, and the power supply 1056 are external to the on-chip system 1002. However, each of these components is coupled to one or more components on the on-chip system. The PDA 1000 may include a power control unit 1057 coupled to the power supply 1056 to selectively activate power to one or more of the other components, such as that described above with respect to FIGS. 1-6.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. An integrated circuit comprising:
   a package including a first package-substrate connection, a second package-substrate connection, and metallization coupling the first package-substrate connection to the second package-substrate connection; and
   a substrate electrically and physically coupled to the package via the first package-substrate connection and the second package-substrate connection, the substrate comprising a plurality of power domains and a power control unit, the second package-substrate connection coupled to a particular power domain of the plurality of power domains, the power control unit comprising logic and a switch, the switch including a first terminal coupled to a voltage supply terminal, a control terminal coupled to the logic, and a second terminal coupled to the first package-substrate connection, the logic configured to selectively activate the switch to distribute power to the particular power domain via the metallization of the package, wherein the switch further comprises a plurality of independent transistors in parallel, and the logic activates the plurality of independent transistors in stages to provide a ramped supply voltage to the second terminal.

2. The integrated circuit of claim 1, wherein the particular power domain comprises a processing unit embedded in the substrate.

3. The integrated circuit of claim 2, wherein the switch is sized to meet a peak demand of the processing unit.

4. The integrated circuit of claim 3, wherein the peak demand of the processing unit is less than a peak power density multiplied by a substrate area of the processing unit.

5. The integrated circuit of claim 1, wherein the package further comprises a flip-chip package.

6. The integrated circuit of claim 1, wherein the power control unit is adapted to generate a current ramp to charge a capacitance associated with the particular power domain.

7. The integrated circuit of claim 1, wherein the logic is adapted to generate a power on reset signal to reset the particular power domain.

8. The integrated circuit of claim 1, wherein the particular power domain further comprises a clamp circuit to clamp outputs from the particular power domain to a known logic state, wherein the power control unit generates an output clamp signal to activate the clamp circuit.

9. The integrated circuit of claim 1, wherein the voltage supply terminal comprises an output terminal of a second package.

10. The integrated circuit of claim 1, wherein the substrate further comprises an electrical trace coupled to the second terminal and to an electrical component of the particular power domain to distribute power to the electrical component via the electrical trace in parallel with the metallization of the package.

11. The integrated circuit of claim 1, wherein the switch is configured to supply a maximum unit load that is less than a sum of maximum loads of the plurality of particular power domains.

12. The integrated circuit of claim 1, wherein the substrate further comprises a power manager integrated circuit coupling the voltage supply terminal to the first terminal of the switch.

13. The integrated circuit of claim 12, wherein the power manager integrated circuit is within the substrate.

14. The integrated circuit of claim 12, wherein the power manager integrated circuit is part of the package.

15. A method comprising:
    receiving a switch activation signal at a control terminal of a switch embedded in a substrate, the substrate including a plurality of domains, wherein the switch is located in a first domain of the plurality of domains;
    switching a signal to a first package-substrate connection of a package coupled to the switch of the substrate responsive to receiving the switch activation signal; and
    receiving the signal at a second domain of the plurality of domains from a second package-substrate connection of the package; wherein the switch comprises a plurality of independent transistors in parallel and switching the signal further comprises activating the plurality of independent transistors in stages over a number of clock cycles to produce a ramp supply voltage applied to the first package-substrate connection.

16. The method of claim 15, wherein receiving a switch activation signal comprises receiving a control signal from power control logic at the control terminal of the switch.

17. The method of claim 15, wherein the first package-substrate connection and the second package-substrate connection are coupled to bumps and wherein the package comprises a flip-chip package physically and electrically coupled to the substrate by the bumps.

18. The method of claim 15, wherein switching the signal comprises selectively coupling a terminal of the switch to the first package-substrate connection to route the signal via metallization of the package.

19. The method of claim 15, wherein the signal comprises a power supply voltage.

20. The method of claim 15, wherein the second domain includes a processor.

21. The method of claim 15, wherein the substrate further comprises a power manager integrated circuit coupling the voltage supply terminal to the first terminal of the switch.

22. The method of claim 21, wherein the power manager integrated circuit is within the substrate.

23. A silicon switched power delivery system comprising:
    means for receiving a power supply from a voltage supply terminal at a power control unit of a substrate;
    means for receiving a control signal;
    means for switching the power supply from the voltage supply terminal to a first power package-substrate connection of a flip-chip package to distribute power from the voltage supply terminal to a localized power domain of the substrate, wherein the flip-chip package includes the first power package-substrate connection and a second power package-substrate connection coupled to the localized power domain; and
    means for controlling a clock signal to activate the switch over a number of cycles to provide a ramped power supply.

24. The silicon switched power delivery system of claim 23, wherein the voltage supply terminal comprises a third package-substrate connection coupled to a first metallization within the package, the first metallization coupled to a power manager integrated circuit.

25. The silicon switched power delivery system of claim 24, wherein the power manager integrated circuit is within the substrate.

26. The silicon switched power delivery system of claim 24, wherein the power manager integrated circuit is part of the flip-chip package.

27. The silicon switched power delivery system of claim 23, wherein the means for receiving a control signal comprises a control terminal of a transistor device.

28. A portable device comprising:
an integrated circuit package comprising a first power input coupled to a power supply voltage terminal, a first power output, a first metallization to electrically couple the first power input and the first power output, a second power input, a second power output, and a second metallization to electrically couple the second power input and the second power output; and
a substrate electrically and physically coupled to the integrated circuit package, the substrate including a plurality of electrically isolated power domains, the substrate comprising:
a power supply input coupled to the second power output and to a particular power domain of the plurality of electrically isolated power domains; and
a switch including a first terminal coupled to the first power output of the integrated circuit package, a control terminal, and a second terminal coupled to the second power input of the integrated circuit package, wherein the switch is configured to selectively switch power to the particular power domain via the second metallization of the integrated circuit package and wherein the switch comprises a plurality of transistors in parallel, wherein the plurality of transistors are activated in stages to provide a ramped supply voltage to the second terminal.

29. The portable device of claim 28, further comprising:
a power module integrated circuit coupled to the power supply voltage terminal to provide a power supply voltage, wherein the power supply voltage is provided by a battery.

30. The portable device of claim 28, wherein the power supply voltage terminal comprises an output package-substrate connection of a second integrated circuit package.

31. The portable device of claim 28, further comprising:
a radio frequency transceiver to send and receive radio frequency signals.

32. An integrated circuit device comprising:
a controller having a first input terminal and an external terminal output to communicate over a metallization portion of an off-substrate package;
an electrical component within a subdomain that is isolated from the controller with respect to a common substrate, wherein the electrical component is responsive to the external terminal output via the metallization portion of the off-substrate package; and
a switch coupled to the first input terminal and to the external terminal output to selectively connect the first input terminal to the external terminal output, the switch comprising a plurality of transistors in parallel, wherein the plurality of transistors are activated in stages to provide a ramped supply voltage to the external terminal output.

33. The integrated circuit device of claim 32, wherein the controller further comprises logic to selectively activate the switch.

34. The integrated circuit device of claim 32, wherein the controller is adapted to communicate a signal over the metallization portion of the off-substrate package to the electrical component.

35. The integrated circuit device of claim 32, wherein the controller is adapted to communicate a power supply voltage over the metallization portion of the off-substrate package to activate the electrical component.

36. The integrated circuit device of claim 32, wherein the off-substrate package comprises an integrated circuit that is physically and electrically coupled to the common substrate via bumps.

* * * * *

UNITED STATES PATENT AND TRADEMARK OFFICE
CERTIFICATE OF CORRECTION

| | | |
|---|---|---|
| PATENT NO. | : 7,902,654 B2 | |
| APPLICATION NO. | : 11/431790 | |
| DATED | : March 8, 2011 | |
| INVENTOR(S) | : Lew G. Chua-Eoan et al. | |

It is certified that error appears in the above-identified patent and that said Letters Patent is hereby corrected as shown below:

Title page, item [75], inventor Lew G. Chua-Eoan's name should be ChUa-Eoan, not ChOa-Eoan.

Signed and Sealed this
Twelfth Day of July, 2011

David J. Kappos
*Director of the United States Patent and Trademark Office*